(12) United States Patent
Nishimura et al.

(10) Patent No.: US 11,516,906 B2
(45) Date of Patent: *Nov. 29, 2022

(54) CIRCUIT BOARD

(71) Applicant: JSR CORPORATION, Minato-ku (JP)

(72) Inventors: Isao Nishimura, Minato-ku (JP);
Nobuyuki Miyaki, Minato-ku (JP);
Toshiaki Kadota, Minato-ku (JP);
Shintarou Fujitomi, Minato-ku (JP);
Tomotaka Shinoda, Minato-ku (JP)

(73) Assignee: JSR CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/647,350

(22) PCT Filed: Sep. 10, 2018

(86) PCT No.: PCT/JP2018/033480
§ 371 (c)(1),
(2) Date: Mar. 13, 2020

(87) PCT Pub. No.: WO2019/054335
PCT Pub. Date: Mar. 21, 2019

(65) Prior Publication Data
US 2020/0344870 A1 Oct. 29, 2020

(30) Foreign Application Priority Data
Sep. 15, 2017 (JP) .............................. JP2017-177602

(51) Int. Cl.
H05K 1/02 (2006.01)
H05K 1/03 (2006.01)
(Continued)

(52) U.S. Cl.
CPC ........... *H05K 1/024* (2013.01); *H05K 1/0242* (2013.01); *H05K 3/285* (2013.01); *H05K 3/38* (2013.01);
(Continued)

(58) Field of Classification Search
CPC ...... H05K 1/024; H05K 1/0242; H05K 3/285; H05K 3/38; H05K 1/03; H05K 3/28; H05K 3/46; B32B 15/08
See application file for complete search history.

(56) References Cited

U.S. PATENT DOCUMENTS 3,644,285 A 2/1972 Higgins
3,657,231 A 4/1972 Booth
(Continued)

FOREIGN PATENT DOCUMENTS

CN 102753604 A 10/2012
CN 103801501 * 5/2014
(Continued)

OTHER PUBLICATIONS

Office Action dated Dec. 10, 2020, in co-pending U.S. Appl. No. 16/647,119.
(Continued)

*Primary Examiner* — Ishwarbhai B Patel
(74) *Attorney, Agent, or Firm* — Oblon, McClelland, Maier & Neustadt, L.L.P.

(57) ABSTRACT

The circuit board according to the present invention includes a wiring portion and a non-wiring portion, the wiring portion having a metal layer and a resin layer, the non-wiring portion having a resin layer, the resin layer at a frequency 10 GHZ having a relative permittivity of from 2 to 3 at 23° C., and the circuit hoard satisfying a relationship: (A−B)/B≤0.1 wherein A is the maximum value of the thickness in the
(Continued)

wiring portion (μm) and B is the minimum value of the thickness in the non-wiring portion (μm).

6 Claims, 3 Drawing Sheets

(51) Int. Cl.
*H05K 3/28* (2006.01)
*H05K 3/38* (2006.01)
*H05K 1/11* (2006.01)

(52) U.S. Cl.
CPC ......... *H05K 1/0237* (2013.01); *H05K 1/0313* (2013.01); *H05K 1/0393* (2013.01); *H05K 1/11* (2013.01)

(56) References Cited

U.S. PATENT DOCUMENTS

| | | | |
|---|---|---|---|
| 3,814,757 A | 6/1974 | Donald | |
| 4,122,128 A | 10/1978 | Lehmann et al. | |
| 4,931,487 A | 6/1990 | Priester, Jr | |
| 5,089,571 A | 2/1992 | Bonk | |
| 2002/0161091 A1 | 10/2002 | Amou et al. | |
| 2004/0101732 A1 | 5/2004 | Alvarez-Gallego et al. | |
| 2006/0159929 A1* | 7/2006 | Tanaka | C07D 405/14 428/413 |
| 2009/0266591 A1 | 10/2009 | Amou et al. | |
| 2011/0108755 A1 | 5/2011 | Laskoski et al. | |
| 2012/0049308 A1 | 3/2012 | Nishimura et al. | |
| 2012/0139655 A1* | 6/2012 | Lin | H05K 1/025 333/1 |
| 2012/0175154 A1 | 7/2012 | Matsuda | |
| 2012/0289654 A1 | 11/2012 | Fleischhaker et al. | |
| 2013/0123542 A1 | 5/2013 | Kitayama et al. | |
| 2013/0306358 A1* | 11/2013 | Ohmori | H05K 1/0242 174/251 |
| 2014/0272722 A1* | 9/2014 | Nakafuji | G03F 7/094 528/211 |
| 2014/0295159 A1 | 10/2014 | Kawasaki et al. | |
| 2014/0326487 A1* | 11/2014 | Ozeki | B32B 15/088 174/254 |
| 2014/0378642 A1 | 12/2014 | Keller et al. | |
| 2015/0016072 A1* | 1/2015 | Iwayama | H01L 21/563 361/748 |
| 2015/0133628 A1 | 5/2015 | Kitayama et al. | |
| 2016/0044784 A1 | 2/2016 | Matsuda | |
| 2016/0044797 A1 | 2/2016 | Matsuda | |
| 2017/0009032 A1 | 1/2017 | Katz | |
| 2017/0188453 A1* | 6/2017 | Sugimoto | G11B 5/486 |
| 2017/0369649 A1* | 12/2017 | Nawate | C08L 71/10 |
| 2018/0009195 A1* | 1/2018 | Takeuchi | B32B 27/34 |
| 2018/0179335 A9 | 6/2018 | Nawate et al. | |
| 2019/0055357 A1* | 2/2019 | Hifumi | C08G 65/4081 |
| 2020/0324538 A1 | 10/2020 | Nishiyama et al. | |

FOREIGN PATENT DOCUMENTS

| | | | |
|---|---|---|---|
| CN | 107113968 | | 8/2017 |
| DE | 1 949 137 | | 4/1970 |
| DE | 42 37 768 A1 | | 5/1993 |
| JP | 5-65352 A | | 3/1993 |
| JP | 2001-301088 A | | 10/2001 |
| JP | 2002-249531 A | | 9/2002 |
| JP | 2002-249531 A5 | | 9/2002 |
| JP | 2004-193501 | | 7/2004 |
| JP | WO2004113327 | * | 12/2004 |
| JP | 2006-328141 A | | 12/2006 |
| JP | 2007-262191 A | | 10/2007 |
| JP | 2008-39703 A | | 2/2008 |
| JP | 2008-284716 A | | 11/2008 |
| JP | 2009-231770 A | | 10/2009 |
| JP | 2012-092261 A | | 5/2012 |
| JP | 2014070111 | * | 4/2014 |
| JP | 2014-197611 A | | 10/2014 |
| JP | 5598258 B2 | | 10/2014 |
| JP | 5630182 B2 | | 11/2014 |
| JP | 5712921 B2 | | 5/2015 |
| JP | 2015-176921 A | | 10/2015 |
| JP | 2015-209510 A | | 11/2015 |
| JP | 2015-209511 A | | 11/2015 |
| JP | 2016-32098 A | | 3/2016 |
| JP | 2016-87799 A | | 5/2016 |
| JP | 2017-24265 A | | 2/2017 |
| JP | 2017-137486 A | | 8/2017 |
| JP | 2017-144730 A | | 8/2017 |
| KR | 10-2017-0097215 A | | 8/2018 |
| ME | 2011-40727 A | | 2/2011 |
| SU | 858316 A | | 11/1985 |
| TW | 201124502 | | 7/2011 |
| TW | 201324057 A1 | | 6/2013 |
| TW | 201604232 | | 2/2016 |
| WO | WO 2010/128661 A1 | | 11/2010 |
| WO | WO 2011/081038 A1 | | 7/2011 |
| WO | WO 2012/014339 A1 | | 2/2012 |
| WO | WO 2013/080929 A1 | | 6/2013 |
| WO | WO 2014/148155 A1 | | 9/2014 |
| WO | WO 2015/098788 A1 | | 7/2015 |
| WO | WO 2016/114287 A1 | | 7/2016 |
| WO | WO 2016/143447 A1 | | 9/2016 |

OTHER PUBLICATIONS

International Search Report dated Nov. 6, 2018, in PCT/JP2018/033477.
U.S. Appl. No. 16/647,119, filed Mar. 13, 2020, Nishimura, I., et al.
International Search Report dated Nov. 27, 2018 in PCT/JP2018/033480, 1 page.
Extended European Search Report dated May 4, 2021 in European Patent Application No. 18856760.6, 7 pages.
Extended European Search Report dated May 26, 2021 in European Patent Application No. 18856178.1, 8 pages.
Office Action which was received in the corresponding CN Application No. 201880059040.X, dated Jul. 6, 2021w/computer generated English Translation, 32 pages.
Office Action as received in the corresponding JP Patent Application No. 2018-168775 dated Dec. 21, 2021 w/English Translation, 9 pages.
Combined Taiwanese Office Action and Search Report dated May 3, 2022 in Taiwanese Patent Application No. 107132425 (with unedited computer generated English translation), 13 pages.
Combined Taiwanese Office Action and Search Report dated May 18, 2022 in Taiwanese Patent Application No. 107132490 (with unedited computer generated English translation), 11 pages.
International Search Report and Written Opinion dated Jun. 27, 2017 in PCT/JP2017/014282, filed on Apr. 5, 2017 (with English Translation), 14 pages.
Saxena, A. et al. "Toughening of an Epoxy Resin with Hydroxy-Terminated Poly (arylene ether nitrile) with Pendent Tertiary Butyl Groups", Journal of Applied Polymer Science, vol. 106, 2007, pp. 14.
Fujioka, H. "Properties and Fine Structures of Epoxy Resins for Electronics," 47(5), 1998 , pp. 2.
Extended European Search Report dated Nov. 15, 2019 in Patent Application No. 17785803.2, 11 pages.
Extended European Search Report dated Feb. 13, 2020 in European Patent Application No. 17785803.2, 12 pages.
Mercer, F. W., et al., "Synthesis and Characterization of New Aromatic Poly(Ether Ketone)s", Journal of Applied Polymer Science, vol. 56, No. 11, XP000542975, Jun. 13, 1995, pp. 1397-1412.
Singaporean Search Report and Written Opinion dated Feb. 11, 2020 in Singaporean Patent Application No. 11201809285 Y, 11 pages.
Combined Chinese Office Action and Search Report dated Jun. 24, 2020 in Chinese Patent Application No. 201780023932.X (with unedited computer generated English translation and English translation of Category of Cited Documents), 16 pages.

(56) References Cited

OTHER PUBLICATIONS

Singaporean Written Opinion dated Jul. 31, 2020 in Singaporean Patent Application No. 11201809285Y, 7 pages.
Combined Taiwanese Office Action and Search Report dated Oct. 7. 2020 in Patent Application No. 106112616 (with unedited computer generated English translation), 13 pages.
Notice of Reasons for Refusal dated Oct. 20, 2020 in Japanese Patent Application No. 2017-078161 (with unedited computer generated English translation), 7 pages.
Extended European Search Report dated Oct. 26. 2020 in European Patent Application No. 20193294.4, 9 pages.
Extended European Search Report dated Oct. 30, 2020 in European Patent Application No. 20193296.9, 9 pages.
Notification of Reason for Refusal dated Oct. 30, 2020 in Korean Patent Application No. 10-2018-7029962 (with unedited computer generated English translation), 14 pages.
Notice of Reasons for Refusal dated Dec. 22, 2020 in Japanese Patent Application No. 2017-078222 (with unedited computer generated English translation), 4 pages.
Combined Taiwanese Office Action and Search Report dated Jan. 13, 2021 in Patent Application No. 106112616 (with unedited computer generated English translation), 12 pages.
Combined Chinese Office Action and Search Report dated Jan. 22, 2021 in Patent Application No. 201780023932.X (with unedited computer-generated English translation), 34 pages.
Notice of Reasons for Refusal dated Jan. 26, 2021 in Japanese Patent Application No. 2017-078221 (with unedited computer generated English translation), 6 pages.
Combined Taiwanese Office Action and Search Report dated Apr. 19, 2021 in Patent Application No. 106112616 (with unedited computer generated English translation), 10 pages.
Combined Chinese Office Action and Search Report dated Aug. 10, 2021 in Chinese Patent Application No. 201780023932.X (with unedited computer generated English translation), 19 pages.
Imin, et al., "Preparation of Pyridazine Containing Polybenzidine Type tt-Conjugated Copolymer," Chemical World, 2006, Issue 1, pp. 21-23 (Year: 2006) (with English abstract).
Dow Chemical, Dow Liquid Epoxy Resins (1999), 44 pages.
Japanese Office Action dated Jul. 12, 2022 in Japanese Patent Application No. 2018-168775 (with unedited computer generated English translation), 10 pages.
Japanese Office Action dated Mar. 1, 2022 in Japanese Patent Application No. 2018-168773 (with English translation), 9 pages.
Japanese Office Action dated Mar. 8, 2022 in Japanese Patent Application No. 2018-168774 (with English translation), 8 pages.
Office Action dated Aug. 26, 2022, in Chinese Patent Application No. 201880058828.9 (with English-language Translation).
Korean Office Action dated Oct. 12, 2022, in Korean Patent Application No. 10-2020-7007170 (with attached computer-generated English translation).

* cited by examiner

CIRCUIT BOARD

FIELD OF INVENTION

The present invention relates to a circuit board including a wiring portion having a resin layer and a metal layer.

BACKGROUND ART

With the recent increase in the performance of information terminal equipment and dramatic advances in network technology, the frequency of electric signals handled in the information communication field has been increasing toward high speed and large capacity transmission. In order to address this, there is an increasing demand for low dielectric constant (low $\varepsilon_r$) and low dielectric loss tangent (low tan δ) materials that can reduce the transmission loss, which is a problem when transmitting and processing high-frequency signals and high-speed digital signals to the printed wiring boards used (for example, see Patent Documents 1 to 4).

As printed wiring boards, a flexible printed circuit board (hereinafter also referred to as "FPC") and a flexible flat cable (hereinafter also referred to as "FFC") are used for electronic and electric devices. The FPC is produced by the steps of processing a copper clad laminate (CCL) including an insulator layer and a copper foil layer to form an electrical circuit, and then attaching an adhesive portion of a coverlay (CL) including an insulating layer and an adhesive layer to the circuit portion to protect the circuit portion. Additionally, FFC is an electrical circuit obtained by using a substrate made of an insulator layer and an adhesive layer and a conductor such as copper foil formed in a wiring form, arranging a plurality of conductors between the adhesive parts of the substrate, and bonding.

CITATION LIST

Patent Literature

Patent Document 1: JP 2014-197611 A
Patent Document 2: JP 2015-176921 A
Patent Document 3: JP 2016-087799 A
Patent Document 4: JP 2016-032098 A

SUMMARY OF INVENTION

Technical Problem

However, electrical signals tend to be attenuated at higher frequencies, and the transmission loss tends to increase. Therefore, mounting boards for next-generation high-frequency (10 GHz or higher), low dielectric for reducing crosstalk between wires and low dielectric loss characteristics for suppressing the transmission loss of electrical signals have become indispensable characteristics for insulator materials. Furthermore, in order to suppress the transmission loss of electrical signals, it is also important that the mounting substrate has excellent smoothness. In particular, in FPC and FFC, an adhesive is used to laminate the resin layer and the metal layer, but the adhesive layer formed by the adhesive is considered to be one of the causes of impairing the low dielectric loss characteristics and the smoothness of the mounting substrate.

The present invention has been made in view of the above circumstances, and an object of the present invention is to provide a circuit board having excellent smoothness and capable of reducing a transmission loss of a high-frequency signal.

Solution to Problem

The present invention has been made to achieve at least part of the above object, and can be achieved as the following embodiments or the application examples.

Application Example 1

An embodiment of the circuit board according to the present invention includes a wiring portion and a non-wiring portion,
the wiring portion having a metal layer and a resin layer,
the non-wiring portion having a resin layer,
the resin layer at a frequency 10 GHz having a relative permittivity of from 2 to 3 at 23° C., and
the circuit board satisfying a relationship:

$$(A-B)B \leq 0.1$$

in which A is a maximum value of a thickness in the wiring portion (μm) and B is a minimum value of a thickness in the non-wiring portion (μm).

Application Example 2

The circuit board according to Application Example 1, in which the metal layer and the resin layer in the wiring portion may be laminated in contact with each other.

Application Example 3

The circuit board according to Application Example 1 or 2, in which a dielectric loss tangent of the resin layer may be from 0.001 to 0.01 at a frequency of 10 GHz at 23° C.

Application Example 4

The circuit board according to any one of Application Examples 1 to 3, in which an elastic modulus of the resin layer may be from 0.1 to 3 GPa.

Application Example 5

The circuit board according to any one of Application Examples 1 to 4, in which a peel strength between the resin layer and the metal layer may be 5 N/cm or greater.

Application Example 6

The circuit board according to any one of Application Examples 1 to 5, in which a thickness of the resin layer may be from 10 to 100 μm, and a thickness of the metal layer may be from 10 to 50 μm.

Effect of the Invention

The circuit board of the present invention has excellent smoothness and is capable of reducing a transmission loss of a high-frequency signal.

DESCRIPTION OF EMBODIMENTS

Preferred embodiments according to the present invention will be described below in detail. It should be understood that the present invention is not limited to only the embodiments described below, but also includes various modifications that are made without departing from the spirit of the present invention.

In this specification, a numerical range described with "from A to B" is meant to include a numerical value A as a lower limit value and a numerical value B as an upper limit value.

1. Circuit Board

The terms used in the present specification are defined as follows.

The "high-frequency signal" refers to an electric signal or a radio wave having a frequency of 10 GHz or higher.

The "high-frequency circuit laminate" refers to a laminated body used when producing a high-frequency circuit driven at a frequency of 10 GHz or higher.

The "B-stage resin layer" refers to a layer in which the resin is semi-cured.

The "C-stage resin layer" refers to a layer in which the resin is completely cured. Note that in the present invention, the "C-stage resin layer" may be simply referred to as a "resin layer".

In addition, the direction herein is defined as follows. That is, three spatial axes orthogonal to each other are defined as an X axis, a Y axis, and a Z axis. The vertical direction is the direction along the Z-axis direction (Z direction), the vertical downward direction is the −Z direction, and the vertical upward direction is the +Z direction. The plane perpendicular to the Z axis is taken as an XY plane.

The circuit board according to the present embodiment includes a wiring portion and a non-wiring portion, the wiring portion having a metal layer and a resin layer, the non-wiring portion having a resin layer, the resin layer at a frequency 10 GHz having a relative permittivity of from 2 to 3 at 23° C., and the circuit board satisfying a relationship:

$$(A-B)/B \leq 0.1$$

in which A is the maximum value of the thickness in the wiring portion (μm) and B is the minimum value of the thickness in the non-wiring portion (μm). Below, the circuit board according to the present embodiment will be described in detail with reference to the drawings.

Figure 1:
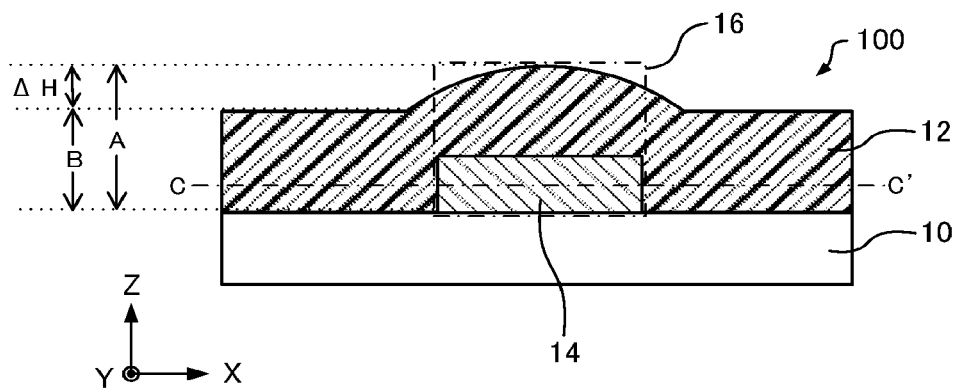
FIG. 1 is a cross-sectional view schematically illustrating a circuit board according to the present embodiment
Figure 2:
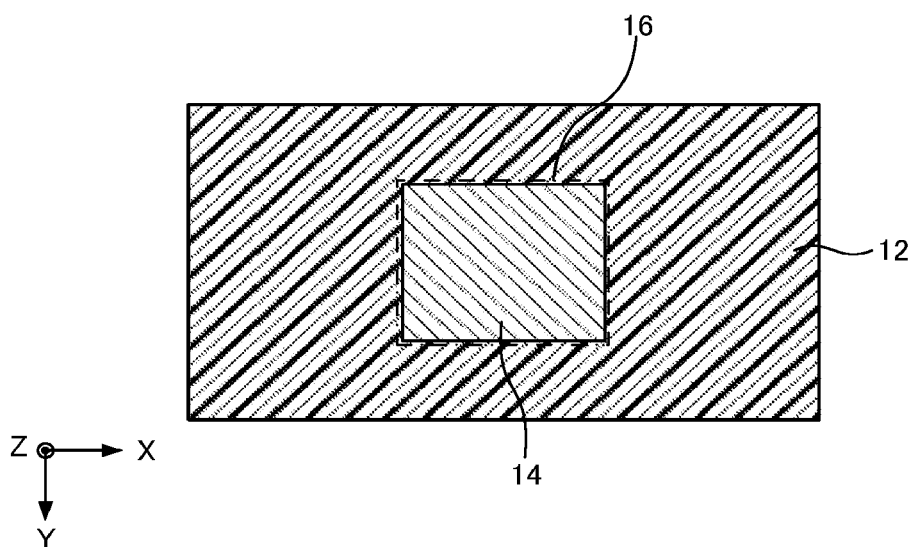
FIG. 2 is a plan view cut along the line C-C' in FIG. 1.

FIG. 1 is a cross-sectional view schematically illustrating a circuit board according to the present embodiment. FIG. 2 is plan view cut along the line C-C' of FIG. 1. As illustrated in FIG. 1, a circuit board 100 includes a resin layer 12 and a metal layer 14 on a substrate 10 (in the +Z direction). In the example of FIG. 1, the resin layer 12 is laminated on the metal layer 14 (in the +Z direction), so that the resin layer 14 existing above the metal layer 14 is in a state of being raised in the +Z direction more than the other resin layer 14.

The substrate 10 is not particularly limited, and may be, for example, a glass epoxy substrate, a metal substrate, a polyester substrate, a polyimide substrate, a BT resin substrate, a thermosetting polyphenylene ether substrate, or a fluororesin substrate. Alternatively, the high-frequency circuit laminate described below may be used as a substrate when producing a multilayer circuit board.

In the circuit board according to the present embodiment, the portions of the metal layer 14 and the resin layer 12 (that is, a region 16) laminated on the metal layer 14 (in the +Z direction) as shown in FIG. 1 are defined as a "wiring portion", and the portion of the resin layer 12 other than the wiring portion is defined as "non-wiring portion".

The circuit board according to the present embodiment satisfies the relationship (A−B)/B≤0.1, in which A is the maximum value of the thickness at the wiring portion (μm) and B is the minimum value of the thickness at the non-wiring portion (μm). The (A−B) is ΔH in FIG. 1. The (A−B)/B is preferably 0.09 or less, and more preferably 0.08 or less, and even more preferably 0.07 or less, yet even more preferably 0.06 or less, and particularly preferably 0.05 or less. In such a circuit board, the resin layer 12 laminated on the metal layer 14 (in the +Z direction), which is a projection of the wiring portion, does not form a large step, and the entire surface of the resin layer 14 is in a smooth state. For this reason, even if circuit boards are laminated, high positioning accuracy can be satisfied, and more layers of circuits can be integrated.

In the present invention, even when such a circuit board is laminated to produce a multilayer circuit board, the maximum value A (μm) of the thickness in the wiring portion and the minimum value B (μm) of the thickness in the non-wiring portion are defined for each resin layer.

In the circuit board according to the present embodiment, the metal layer 14 and the resin layer 12 are preferably laminated in contact with each other. That is, it is preferable that no adhesive layer such as a primer resin layer is interposed between the metal layer and the resin layer. In a general circuit board, an adhesive layer is interposed between the resin layer and the metal layer in order to improve the adhesion between the metal layer having the conductive function and the resin layer having the insulating function. The adhesive layer is formed by a method such as application using an adhesive mainly containing a polymer having a polar functional group. However, such an adhesive layer has poor electrical characteristics, so that the effective dielectric constant and effective dielectric loss of the resin layer having an insulating function are increased, and are not suitable for high-frequency circuits. In contrast, the circuit board according to the present embodiment has good adhesion between the metal layer and the resin layer without using an adhesive, and the metal layer and the resin layer are laminated in contact with each other. As a result, a circuit board suitable for a high-frequency circuit was successfully obtained without deteriorating the effective electrical characteristics of the resin layer.

In the circuit board according to the present embodiment, the peel strength between the resin layer and the metal layer is preferably 5 N/cm or greater, more preferably 5.3 N/cm or greater, and particularly preferably 6 N/cm or greater. Since the circuit board according to the present embodiment has a peel strength in the above-described range, the adhesion between the metal layer and the resin layer is good even without using an adhesive. Note that the peel strength can be measured in accordance with the method described in "IPC-TM-650 2.4.9".

Hereinafter, the configuration and production method of each layer constituting the circuit board according to the present embodiment will be described in detail.

1.1. Resin Layer

The circuit board according to the present embodiment includes a resin layer. The elastic modulus of the resin layer is preferably from 0.1 to 3 GPa, and more preferably from 0.2 to 2.5 GPa. When the elastic modulus of the resin layer is within the above range, a circuit board having excellent flexibility can be obtained, so that a circuit board can be produced under more free conditions. The elastic modulus of the resin layer is a tensile modulus of elasticity, and can be measured in accordance with JIS K7161.

The relative permittivity of the resin layer at a frequency of 10 GHz at 23° C. is from 2 to 3, and preferably from 2.1 to 2.8. When the relative permittivity at 10 GHz is within the above range, a circuit board having excellent high-frequency characteristics can be produced. In addition, the dielectric loss tangent of the resin layer at a frequency of 10 GHz at 23° C. is preferably from 0.001 to 0.01, and more preferably from 0.002 to 0.009. When the dielectric loss tangent at a frequency of 10 GHz is within the above range, a circuit board having excellent high-frequency characteristics can be produced. The relative permittivity and the dielectric loss tangent at a frequency of 10 GHz can be measured using a cavity resonator perturbation method dielectric constant measurement device.

In addition, the thickness of the resin layer is preferably from 10 to 100 μm, more preferably from 20 to 90 μm, and particularly preferably from 25 to 80 μm.

The present invention also includes an embodiment in which the resin layer is composed of a plurality of different resin layers. When the resin layer includes a plurality of resin layers, the elastic modulus, relative permittivity, and dielectric loss tangent of each resin layer need not necessarily be limited to the preferable ranges described above, and is required to be in a preferred range as a whole.

The method for producing the resin layer is not particularly limited, and it can be produced by a method such as applying the resin layer composition to a substrate such as a release layer or a metal foil, or extruding the composition to produce a self-standing film.

The composition of the resin layer composition is not particularly limited as long as the resin layer to be obtained has a composition satisfying the relative permittivity described above, and preferably contains a polymer, a curable compound, and as necessary, a curing aid and a solvent.

1.1.1. Resin Layer Composition

Polymer

As the polymer that can be included in the resin layer composition, for example, a known material having low dielectric constant and low dielectric loss tangent characteristics such as an epoxy resin, a polyimide, or a polyarylene may be used as appropriate. In particular, a polymer having a repeating unit represented by at least one of Formulas (1-1), (1-2) and (1-3) below are preferably used.

[Formula 1]

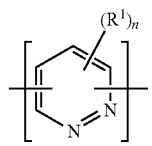

(1-1)

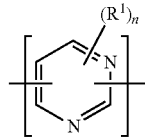

(1-2)

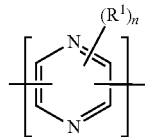

(1-3)

(Where in Formulas (1-1) to (1-3), $R^1$ are each independently a halogen atom, a monovalent hydrocarbon group having from 1 to 20 carbon atoms, a monovalent halogenated hydrocarbon group having from 1 to 20 carbons, a nitro group, a cyano group, any of primary to tertiary amino groups, or any of salts of primary to tertiary amino groups. The n is each independently an integer from 0 to 2. In a case where n is 2, the plurality of $R^1$s may be the same or different, and may be bonded in any combination to form part of a ring structure.)

The $R^1$ is preferably a halogen atom, a monovalent hydrocarbon group having from 1 to 6 carbon atoms, a monovalent halogenated hydrocarbon group having from 1 to 6 carbon atoms, a nitro group, a cyano group, a primary to tertiary amino group, or a salt of a primary to tertiary amino group, and more preferably a fluorine atom, a chlorine atom, a methyl group, a nitro group, a cyano group, a t-butyl group, a phenyl group, or an amino group. The n is preferably 0 or 1, and more preferably 0.

The position of the other bond with respect to one bond of the repeating unit is not particularly limited, but the meta position is preferred from the viewpoint of improving the polymerization reactivity of the monomer giving the repeating unit. The repeating unit is preferably a structural unit having a pyrimidine skeleton and represented by Formula (1-2) above.

The polymer may have a repeating unit other than the repeating unit represented by at least one of Formulas (1-1), (1-2) and (1-3) above as necessary, and the content ratio of the repeating unit represented by at least one of Formulas (1-1), (1-2) and (1-3) above in the polymer is preferably from 5 to 95 mol %, and more preferably from 10 to 60 mol % when the total of all the structural units in the polymer is 100 mol %.

The method for synthesizing the polymer having a repeating unit represented by at least one of Formulas (1-1), (1-2) and (1-3) above is not particularly limited, and may be a known method. For example, it can be synthesized by heating a monomer that provides a repeating unit represented by at least one of Formulas (1-1), (1-2) and (1-3) above and other monomer as necessary in an organic solvent together with an alkali metal and the like.

The lower limit of the weight average molecular weight (Mw) of the polymer having a repeating unit represented by at least one of Formulas (1-1), (1-2) and (1-3) above is preferably 500, more preferably 1000, still more preferably 10000, and particularly preferably 30000. The upper limit of the weight average molecular weight (Mw) is preferably 600000, more preferably 400000, even more preferably 300000, and particularly preferably 200000.

The lower limit of the glass transition temperature (Tg) of the polymer having a repeating unit represented by at least one of Formulas (1-1), (1-2) and (1-3) above is preferably 150° C., and more preferably 180° C. The upper limit of the glass transition temperature (Tg) is preferably 320° C., and more preferably 300° C.

The polymer preferably further has a repeating unit represented by General Formula (2) below.

[Formula 2]

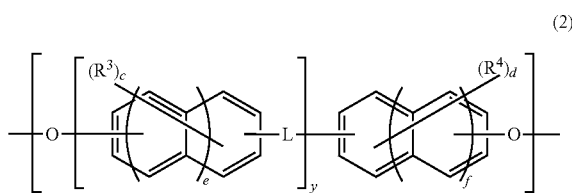

(2)

(In Formula (2), $R^3$ and $R^4$ are each independently a halogen atom, a nitro group, a cyano group, or a divalent organic group having from 1 to 20 carbon atoms, c and d are each independently an integer from 0 to 8, e, f, and y are each independently an integer of 0 to 2, and L is a single bond, —O—, —S—, —CO—, —SO—, —SO$_2$—, or a divalent organic group having from 1 to 20 carbon atoms.)

Examples of the halogen atoms represented by $R^3$ and $R^4$ include a fluorine atom, a chlorine atom, a bromine atom and an iodine atom.

Examples of the monovalent hydrocarbon group having from 1 to 20 carbons represented by $R^3$ and $R^4$ include a monovalent linear hydrocarbon group, a monovalent alicyclic hydrocarbon group, and a monovalent aromatic hydrocarbon group.

Examples of the monovalent linear hydrocarbon group include alkyl groups such as a methyl group, an ethyl group, a n-propyl group, an i-propyl group, a n-butyl group, an i-butyl group, a sec-butyl group, a t-butyl group, a n-pentyl group; alkenyl groups such as an ethenyl group, a propenyl group, a butenyl group, and a pentenyl group; and alkynyl groups such as an ethynyl group, a propynyl group, a butynyl group, and a pentynyl group.

Examples of the monovalent alicyclic hydrocarbon group include monocyclic cycloalkyl groups such as a cyclopropyl group, a cyclobutyl group, a cyclopentyl group, and a cyclohexyl group; polycyclic cycloalkyl groups such as a norbornyl group and an adamantyl group; monocyclic cycloalkenyl groups such as a cyclopropenyl group, a cyclobutenyl group, a cyclopentenyl group, and a cyclohexenyl group; and polycyclic cycloalkenyl groups such as a norbornenyl group.

Examples of the monovalent aromatic hydrocarbon group include aryl groups such as a phenyl group, a tolyl group, a xylyl group, a naphthyl group, and an anthryl group; and aralkyl groups such as a benzyl group, a phenethyl group, a phenylpropyl group, and a naphthylmethyl group.

Examples of the monovalent halogenated hydrocarbon group having 1 to 20 carbon atoms represented by $R^3$ and $R^4$ include groups in which part or all of the hydrogen atoms of the monovalent hydrocarbon group having from 1 to 20 carbon atoms exemplified as the group represented by $R^3$ and $R^4$ is substituted with a halogen atom such as a fluorine atom, a chlorine atom, a bromine atom, or an iodine atom.

Examples of the divalent organic group having from 1 to 20 carbon atoms represented by L include divalent linear hydrocarbon groups having from 1 to 20 carbon atoms, divalent fluorinated linear hydrocarbon groups having from 1 to 20 carbon atoms, divalent aromatic hydrocarbon groups having from 6 to 20 carbon atoms, and divalent fluorinated aromatic hydrocarbon groups having from 6 to 20 carbon atoms.

Examples of the divalent linear hydrocarbon group include a methylene group, an ethylene group, an n-propylene group, an isopropylene group, an n-butylene group, a sec-butylene group, a t-butylene group, a neopentylene group, a 4-methyl-pentane-2,2-diyl group, and a nonane-1,9-diyl group Examples of the divalent alicyclic hydrocarbon group include monocyclic cycloalkyl groups such as a cyclopropyl group, a cyclobutyl group, a cyclopentyl group, and a cyclohexyl group; polycyclic cycloalkyl groups such as a norbornyl group and an adamantyl group; monocyclic cycloalkenyl groups such as a cyclopropenyl group, a cyclobutenyl group, a cyclopentenyl group, and a cyclohexenyl group; and polycyclic cycloalkenyl groups such as a norbornenyl group.

Examples of the divalent aromatic hydrocarbon group include aryl groups such as a phenyl group, a tolyl group, a xylyl group, a naphthyl group, and an anthryl group; and aralkyl groups such as a benzyl group, a phenethyl group, a phenylpropyl group, and a naphthylmethyl group.

Examples of these polymers include the polymers described in JP 2015-209511 A, WO 2016/143447, JP 2017-197725 A, and JP 2018-024827 A.

The content ratio of the polymer in the resin layer composition is preferably 10 parts by mass or greater and 90 parts by mass or less with respect to a total of 100 parts by mass of the below-described curable compound and polymer.

Curable Compound

The curable compound is a compound that is cured by irradiation with heat or light (for example, visible light, ultraviolet light, near infrared radiation, far infrared radiation, electron beam, or the like), and may require a curing aid to be described later. Examples of such a curable compound include epoxy compounds, cyanate ester compounds, vinyl compounds, silicone compounds, oxazine compounds, maleimide compounds, allyl compounds, acrylic compounds, methacryl compounds, and urethane compounds. These may be used alone or in combination of two or more of them. Among these, from the viewpoint of compatibility with the polymer and properties such as heat resistance, at least one of an epoxy compound, a cyanate ester compound, a vinyl compound, a silicone compound, an oxazine compound, a maleimide compound, and an allyl compound is preferable, and at least one of an epoxy compound, a cyanate ester compound, a vinyl compound, an allyl compound, and a silicone compound is more preferable.

The content ratio of the curable compound in the resin layer composition is preferably 10 parts by mass or greater and 90 parts by mass or less, and more preferably 20 parts by mass or greater and 80 parts by mass or less with respect to 100 parts by mass of the resin layer composition.

Curing Aid

Examples of curing aids include polymerization initiators such as a photoreaction initiator (a photoradical generator, a photoacid generator, and a photobase generator). Specific examples of the curing aid include onium salt compounds, sulfone compounds, sulfonate compounds, sulfonimide compounds, disulfonyldiazomethane compounds, disulfonylmethane compounds, oxime sulfonate compounds, hydrazine sulfonate compounds, triazine compounds, nitrobenzyl compounds, benzylimidazole compounds, organic halides, octyl acid metal salts, and disulfone. These curing aids may be used alone or in combination of two or more of them, regardless of the type.

The content ratio of the curing aid in the resin layer composition is preferably 5 parts by mass or greater and 20 parts by mass or less, more preferably 5 parts by mass or greater and 10 parts by mass or less with respect to 100 parts by mass of the resin layer composition.

Solvent

The resin layer composition may contain a solvent as necessary. Examples of the solvent include amide solvents such as N,N-dimethylacetamide, N,N-dimethylformamide, N-methyl-2-pyrrolidone, N-ethyl-2-pyrrolidone, 1,3-dimethyl-2-imidazolidinone; ester solvents such as γ-butyrolactone and butyl acetate; ketone solvents such as cyclopentanone, cyclohexanone, methyl ethyl ketone, and benzophenone; ether solvents such as 1,2-methoxyethane and diphenyl ether; polyfunctional solvents such as 1-methoxy-2-propanol and propylene glycol methyl ether acetate; sulfone solvents such as sulfolane, dimethyl sulfoxide, diethyl sulfoxide, dimethyl sulfone, diethyl sulfone, diisopropyl sulfone, and diphenyl sulfone; methylene chloride, benzene, toluene, xylene, dialkoxybenzene (carbon number of alkoxy group; from 1 to 4), and trialkoxybenzene (carbon number of alkoxy group; from 1 to 4). These solvents may be used alone or in combination of two or more of them.

When the resin layer composition contains a solvent, the amount is preferably 2000 parts by mass or less, more preferably 200 parts by mass or less with respect to 100 parts by mass of the resin layer composition excluding the solvent.

Other Component

The resin layer composition may contain other components as necessary. Examples of other components include antioxidants, strengthening agents, lubricants, flame retardants, antibacterial agents, coloring agents, release agents, foaming agents, and polymers other than the above polymers.

Method for Preparing Resin Layer Composition

The method for preparing the resin layer composition is not particularly limited. For example, it can be prepared by uniformly mixing a polymer, a curable compound, and other additives as necessary (for example, other components such as a curing aid, a solvent, and an antioxidant). In addition, the composition may be in the form of a liquid, a paste, or the like.

1.2. Metal Layer

The circuit board according to the present embodiment includes a metal layer. The metal layer is preferably a metal foil or a sputtered film. The metal foil is preferably a copper foil. There are two types of copper foil, electrolytic foil and rolled foil, and either one may be used.

The surface roughness Ra of the metal layer is preferably from 10 to 300 nm, more preferably from 30 to 200 nm, and particularly preferably from 30 to 100 nm. When the surface roughness Ra of the metal layer is within the above range, the adhesion between the resin layer and the metal layer can be further improved when producing the circuit board according to the present embodiment. Further, the in-plane thickness of the circuit board can be made more uniform, and the peeling of the resin layer and the metal layer can be suppressed when the circuit board is wound into a roll. Note that the surface roughness Ra of the metal layer refers to "arithmetic mean roughness" measured according to JIS B0601-2001.

The thickness of the metal layer is preferably from 3 to 50 μm, more preferably from 5 to 40 μm, and particularly preferably from 7 to 35 μm.

When a metal foil is used as the metal layer, a thinner one may be used as it is as long as the surface roughness Ra of the metal foil is within the above range, and the surface of the foil may be physically or chemically treated to control the surface roughness Ra within the above range. Methods for controlling the roughness of the surface of the metal foil include, but are not limited to, etching (such as acid treatment), laser treatment, electrolytic plating, electroless plating, sputtering, and sandblasting of the metal foil.

1.3. Method for Producing Circuit Board

A circuit board such as FPC can be manufactured using a high-frequency circuit laminate in which a metal layer and a resin layer are laminated. The method for producing the high-frequency circuit laminate s not particularly limited as long as the resin layer and the metal layer can be laminated in contact with each other. "The resin layer and the metal layer are in contact with each other" is not limited to the case where one surface of the resin layer is in contact with the entire surface of the metal layer, and includes the case where at least a part of the one surface of the resin layer is in contact with the metal layer.

The thickness of the high-frequency circuit laminate used in the present embodiment is preferably from 50 to 200 μm, more preferably from 60 to 180 μm, and particularly preferably from 70 to 150 μm. When the thickness of the high-frequency circuit laminate is within the aforementioned range, the high-frequency circuit board with a small thickness is produced, and it will not be easily curled when wound around a core.

Preferred examples of producing the high-frequency circuit laminate will be described below.

Production Example A

FIGS. 3A to 3D are diagrams schematically illustrating cross sections in the steps of Production Example A. Production Example A will be described with reference to FIGS. 3A to 3D.

(Step A1)

Figure 3A:
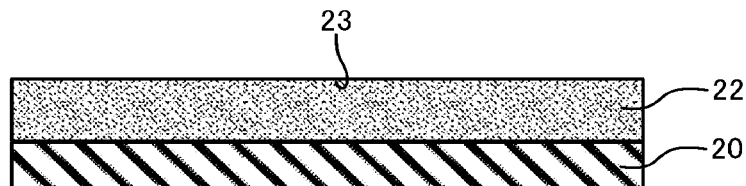
FIG. 3A is a cross-sectional view schematically illustrating the step A1 in Production Example A of the high-frequency circuit laminate.

As illustrated in FIG. 3A, a B-stage resin layer 22 is formed by applying a resin layer composition on a release layer 20, and a "B-stage resin layer/release layer laminate" (also referred to as a "B-stage sheet") is produced. As the release layer 20, a known film such as a PET film may be used. The PET film is not particularly limited, and may be, for example, Panaprotect MK38S available from PANAC Co., Ltd. The method for applying the resin layer composition may be a known application method. For example, it is preferable to apply the composition while adjusting the film thickness using a bar coater.

It is preferable to form the semi-cured B-stage resin layer 22 using a known heating means such as an oven after the resin layer composition is applied to the release layer 20 as described above. The heating temperature is preferably from 50 to 150° C., and more preferably from 70 to 130° C. When heating, the heating may be performed in two stages, such as from 50 to 100° C. and from 100 to 150° C. In addition, the total heating time is preferably less than 30 minutes, and more preferably less than 20 minutes. By heating under the conditions of temperature and time in the above ranges, the B-stage resin layer 22 having high film thickness uniformity can be produced. In addition, by suppressing the deterioration of the release layer 20, the release layer 20 can be satisfactorily peeled in the production process.

The surface roughness Ra of the B-stage resin layer 22 exposed on the surface is preferably from 1 to 100 nm, and more preferably from 10 to 50 nm. When the surface roughness Ra of the B-stage resin layer 22 is within the above range, the adhesion between the resin layer and the metal layer or between the resin layers can be further improved when producing a high-frequency circuit laminate. Note that the surface roughness Ra of the B-stage resin layer in the present invention refers to "arithmetic mean roughness" measured according to JIS B0601-2001.

The elastic modulus of the B-stage resin layer 22 is preferably such that the maximum value of the elastic modulus (MPa) is 1 MPa or greater, and more preferably 3 MPa or greater at 50° C. or higher and lower than 80° C. under the measurement condition of 1 Hz. In addition, the minimum value of the elastic modulus (MPa) in the temperature range of 80° C. or higher and 200° C. or lower is preferably 20 MPa or less, and more preferably 15 MPa or less. When the elastic modulus of the B-stage resin layer is in each temperature range, when the high-frequency circuit laminate is produced by hot pressing, the unevenness of the wiring portion and the non-wiring portion can be suppressed, whereby the transmission loss can be suppressed.

(Step A2)

Figure 3B:
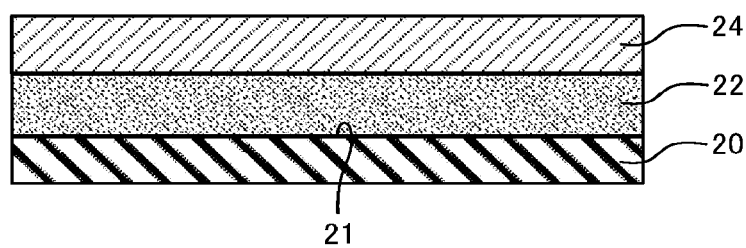
FIG. 3B is a cross-sectional view schematically illustrating a step A2 in Production Example A of the high-frequency circuit laminate.

As illustrated in FIG. 3B, the exposed resin layer surface 23 of the "B-stage resin layer/release layer laminate" produced in the step A1 is bonded to the metal layer 24 to produce a "metal layer/B-stage resin layer/release layer laminate". The surface roughness Ra of the metal layer 24 bonded to the resin layer surface 23 is preferably from 10 to 300 nm, more preferably from 30 to 200 nm, and particularly preferably from 30 to 100 nm.

When bonding, the resin layer surface 23 of the "B-stage resin layer/release layer laminate" and the metal layer 24 are overlaid, and then preferably thermocompressed using a heated roll (also referred to as a "hot roll" in the present specification) or the like. The linear load at the time of thermocompression bonding is preferably from 1 to 19 kN/m, and more preferably from 5 to 18 kN/m. The temperature of the thermocompression bonding is preferably from 50 to 200° C., more preferably from 50 to 150° C., and particularly preferably from 70 to 130° C.

Further, in the step A2, the "metal layer/B-stage resin layer/release layer laminate" immediately after bonding may be further subjected to annealing treatment by subsequently contacting the laminate with a heated roll or passing it through a heating furnace. The annealing treatment may be performed at a temperature equal to or higher than the melting point of the resin, and is preferably, for example, from 100 to 250° C., and more preferably from 110 to 230° C. The heating time is not particularly limited, but is preferably from 5 to 600 seconds, and more preferably from 10 to 300 seconds. By performing annealing treatment in a short period of time of, for example, about 5 to 600 seconds using a hot roll, a B-stage resin layer having high film thickness uniformity can be produced. In addition, by suppressing deterioration of the release layer, the release can be peeled off satisfactorily in the production process. Note that the above-described described "the "metal layer/B-stage resin layer/release layer laminate" immediately after bonding" is further treated" refers to the step in which the laminate, which had been bonded in the production line for bonding the laminate, is further treated in-line after the bonding treatment, without taking out the bonded laminate from the production line.

(Step A3)

Figure 3C:
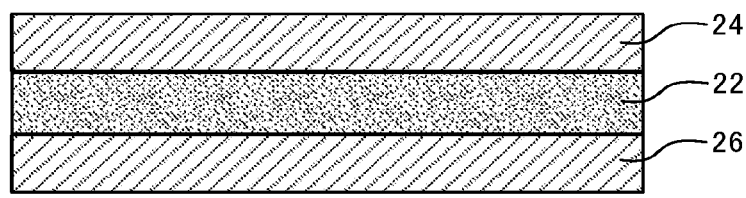
FIG. 3C is a cross-sectional view schematically illustrating a step A3 in Production Example A of the high-frequency circuit laminate.

As illustrated in FIG. 3C, the release layer 20 is peeled off from the "metal layer/B-stage resin layer/release layer laminate" produced in the step A2, and the exposed resin layer surface 21 and the metal foil 26 are bonded as necessary. When the release layer 20 is peeled off from the "metal layer/B-stage resin layer/release layer laminate" and the exposed B-stage resin layer surface 21 is bonded to the metal layer 26, it is preferable that the exposed resin layer surface 21 and the metal layer 26 are overlaid, and further subjected to thermocompression bonding using a hot roll or the like. The thermocompression bonding is preferably performed under the same conditions as in the step A2.

The surface roughness Ra of the resin layer surface 21 exposed by peeling the release layer 20 from the "metal layer/B-stage resin layer/release layer laminate" is preferably from 1 to 100 nm, and more preferably from 10 to 50 nm. When the surface roughness Ra of the B-stage resin layer is within the above range, when producing a high-frequency circuit laminate, the adhesion between the resin layer and the metal layer or between the resin layers can be further improved.

(Step A4)

Figure 3D:
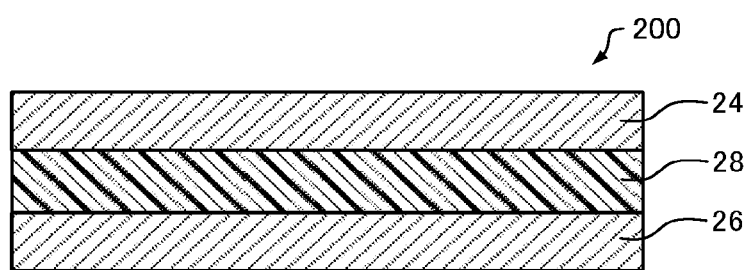
FIG. 3D is a cross-sectional view schematically illustrating a step A4 in Production Example A of the high-frequency circuit laminate.

As illustrated in FIG. 3D, the B-stage resin layer 22 is cured to form a C-stage resin layer 28, thereby obtaining a high-frequency circuit laminate 200. In order to cure the B-stage resin layer 12, the laminate obtained in the step A3 is preferably heated to 50 to 200° C., and more preferably to 100 to 200° C. using a known heating means such as an oven. When heating, the heating may be performed in two stages such as from 50 to 100° C. and from 100 to 200° C. In addition, the heating time is preferably less than 5 hours, and more preferably less than 3 hours. By heating under the conditions of temperature and time in the above ranges, the B-stage resin layer can be cured to produce a C-stage resin layer with high thickness uniformity <Production Example B>

Figure 4A:
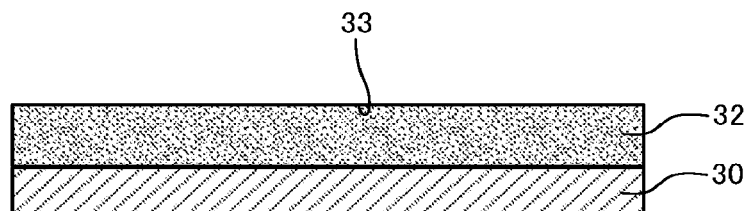
FIG. 4A is a cross-sectional view schematically illustrating a step B1 in Production Example B of the high-frequency circuit laminate.
Figure 4B:
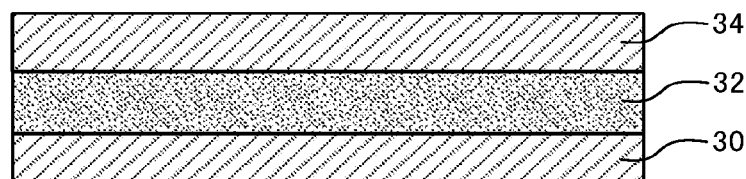
FIG. 4B is a cross-sectional view schematically illustrating a step B2 in Production Example B of the high-frequency circuit laminate.
Figure 4C:
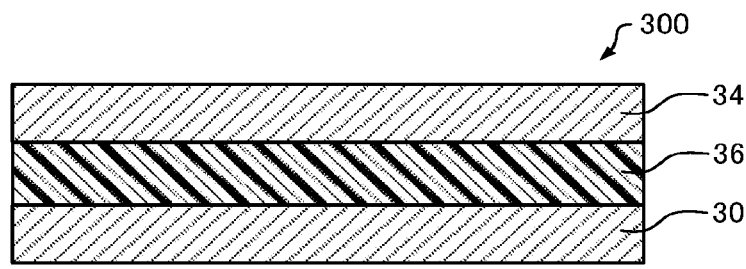
FIG. 4C is a cross-sectional view schematically illustrating a step B3 in Production Example B of the high-frequency circuit laminate.

FIGS. 4A to 4C are diagrams schematically illustrating the cross sections in the steps of Production Example B. Production Example B will be described with reference to FIGS. 4A to 4C.

(Step B1)

As illustrated in FIG. 4A, a resin layer composition is applied to the metal layer 30 to form a B-stage resin layer 32, thereby producing a "metal layer/B-stage resin layer laminate". The coating method of the resin layer composition may be a known coating method, but it is preferable to use a bar coater to adjust the film thickness of the coating.

After the resin layer composition is applied to the metal layer 30 as described above, it is preferable to form the semi-cured B-stage resin layer 32 using a known heating means such as an oven. The heating temperature is preferably from 50 to 150° C., and more preferably from 70 to 130° C. When heating, the heating may be performed in two stages, such as from 50 to 100° C. and from 100 to 150° C. In addition, the total heating time is preferably less than 30 minutes, and more preferably less than 20 minutes. By heating under the conditions of temperature and time in the above ranges, the B-stage resin layer 32 with high film thickness uniformity can be produced.

(Step B2)

As illustrated in FIG. 4B, the metal layer 34 is bonded to the exposed resin layer surface 33 of the "metal layer/B-stage resin layer laminate" produced in the step B1, thereby producing a "metal layer/B-stage resin layer/metal layer laminate". When the metal layer 34 is bonded to the exposed resin layer surface 33, it is preferable that the exposed resin layer surface 33 and the metal layer 34 are overlaid, and then thermocompressed using a hot roll or the like. In addition, the thermocompression bonding is preferably performed under the same conditions as in the step A2.

Further, in the step B2, an annealing process may be performed by continuing the "metal layer/B-stage resin layer/metal layer" immediately after the bonding by contacting the heated roller or passing it through the heating furnace. The annealing treatment is preferably performed under the same conditions as in the step A2.

The surface roughness Ra of the exposed resin layer surface 33 is preferably from 1 to 100 nm, and more preferably from 10 to 50 nm. When the surface roughness Ra of the B-stage resin layer is within the above-described range, the adhesion between the resin layer and the metal layer can be further improved when producing a high-frequency circuit laminate. Furthermore, the surface roughness Ra of the metal layer 34 to be bonded to the resin layer surface 33 is preferably from 10 to 300 nm, more preferably from 30 to 200 nm, and particularly preferably from 30 to 100 nm.

(Step B3)

As illustrated in FIG. 4C, the B-stage resin layer 32 is cured to form a C-stage resin layer 36, thereby obtaining a high-frequency circuit laminate 300. In the step B3, the "metal layer/B-stage resin layer/metal layer laminate" produced in the step B2 is preferably heated to 50 to 200° C., and more preferably heated to 100 to 200° C. using a known heating means such as an oven. When heating, the heating may be performed in two stages, such as from 50 to 100° C. and from 100 to 200° C. In addition, the heating time is preferably less than 5 hours, and more preferably less than 3 hours. By heating under the conditions of temperature and time in the above-described ranges, the B-stage resin layer 32 can be cured to produce the C-stage resin layer 36 with high film thickness uniformity.

A circuit board such as FPC can be produced using the high-frequency circuit laminate thus obtained. In such a circuit board, the transmission loss can be reduced even when driven at a high frequency by using the above-described high-frequency circuit laminate as at least a part of the laminate structure. Such a circuit board is required to include the above-described high-frequency circuit laminate as a part of a laminated structure, and can be produced by applying the production process described in, for example, WO 2012/014339 and JP 2009-231770 A.

Specifically, a circuit board can be produced by, for example, laminating the above-described high-frequency circuit laminate, patterning the metal layer of the above-described high-frequency circuit laminate by etching, drilling it, or cutting it to a required size.

In such a circuit board, since no adhesive layer is interposed, the resin layer covering the metal wiring layer, which is a convex portion, does not have a large step, and the surface of the resin layer is smooth. For this reason, even if circuits are laminated, high positioning accuracy can be satisfied, and more layers of circuits can be integrated.

Such a circuit board can be produced by, for example, step (a): a step of laminating a resin film on a circuit board to form a resin layer;

step (b): a step of flattening the resin layer by heating and pressing; and step (c): a step of further forming a circuit layer on the resin layer.

The method for laminating the resin film on the circuit board in the step (a) is not particularly limited, and examples thereof include lamination methods using a multi-stage press, a vacuum press, a normal pressure laminator, or a laminator that heats and presses under vacuum. Among them, the method using a laminator that heats and presses under vacuum is preferable. As a result, even if the circuit board has a fine wiring circuit on the surface, there is no void and the space between the circuits can be embedded with the resin. The lamination conditions are not particularly limited, but the compression temperature is from 70 to 130° C., the compression pressure is from 1 to 11 kgf/cm$^2$, and the lamination is preferably performed under reduced pressure or vacuum. The lamination may be performed by a batch system or a continuous system using rolls.

The circuit substrate is not particularly limited, and may be, for example, a glass epoxy substrate, a metal substrate, a polyester substrate, a polyimide substrate, a BT resin substrate, a thermosetting polyphenylene ether substrate, or a fluororesin substrate. The circuit surface of the surface on which the resin film of the circuit board is laminated may be pre-roughened. Further, the number of circuit layers of the circuit board is not limited. For example, when producing a printed wiring board for a millimeter-wave radar, the number of circuit layers may be freely selected from 2 to 20 according to the design.

In the step (b), the resin film and the circuit board laminated in the step (a) are heated and pressed to flatten. The conditions are not particularly limited, but the temperature is preferably from 100° C. to 250° C., the pressure is preferably from 0.2 to 10 MPa, and the time is preferably from 30 to 120 minutes, and the temperature is more preferably from 150° C. to 220° C.

In the step (c), a circuit layer is further formed on the resin layer formed by heating and pressing the resin film and the circuit board. The method for forming the circuit layer formed on the resin layer as described above is not particularly limited. The circuit layer may be formed by, for example, an etching method such as a subtractive method, or a semi-additive method.

The subtractive method is a method for forming a desired circuit, including forming an etching resist layer having a shape corresponding to a desired pattern shape on a metal layer, and dissolving and removing the metal layer in a portion, where the resist has been removed, with a chemical solution by a subsequent development process.

The semi-additive method is a method for forming a desired circuit layer, including forming a metal film on the surface of the resin layer by electroless plating, forming a plating resist layer having a shape corresponding to a desired pattern on the metal film, and then forming a metal layer by electrolytic plating, followed by removing unnecessary electroless plating layer with a chemical solution or the like.

Additionally, holes such as via holes may be formed in the resin layer as needed. The method for forming the holes is not limited, and may use, for example, an NC drill, a carbon dioxide laser, a UV laser, a YAG laser, or plasma.

2. Examples

The present invention will be described in detail below based on examples, but the present invention is not limited to these examples. The "parts" and "%" in the examples and comparative examples are based on mass unless otherwise specified.

2.1. Synthesis of Polymer

Synthesis Example 1

In a four-neck separable flask equipped with a stirrer, 1,1-bis (4-hydroxyphenyl)-3,3,5-trimethylcyclohexane (BisTMC) (18.6 g, 60.0 mmol), 4,6-dichloropyrimidine (Pym) (8.9 g, 60.0 mmol), and potassium carbonate (11.1 g, 81.0 mmol) were weighed, N-methyl-2-pyrrolidone (64 g) was added, and the reaction was carried out at 130° C. for 6 hours in a nitrogen atmosphere. After completion of the reaction, N-methyl-2-pyrrolidone (368 g) was added, salts were removed by filtration, and then the solution was poured into methanol (9.1 kg). The precipitated solid was separated by filtration, washed with a small amount of methanol, recovered by filtration again, and then dried under reduced pressure at 120° C. for 12 hours using a vacuum dryer, thereby obtaining a polymer P-1 having a structural unit represented by the following formula (P-1) (recovery amount; 20.5 g, yield; 90%, weight average molecular weight (Mw); 32,000, glass transition temperature) (Tg); 206° C.).

[Chemical Formula 3]

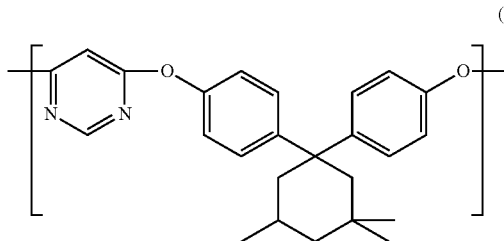

(P-1)

Note that the glass transition temperature (Tg) was measured using a dynamic viscoelasticity measuring device ("DMS7100" available from Seiko Instruments Inc.) at a frequency of 1 Hz and a temperature rising rate of 10° C./minute, and used the temperature at which the loss tangent was at a maximum. The loss tangent was a value obtained by dividing the storage elastic modulus by the loss elastic modulus.

In addition, the weight average molecular weight (Mw) was measured under the following conditions using a GPC apparatus ("HLC-8320" available from Tosoh Corporation).

Column: the one connecting "TSK gel α-M" available Tosoh Corporation and "TSK gel guard column α" available Tosoh Corporation
 Developing solvent: N-methyl-2-pyrrolidone
 Column temperature: 40° C.
 Flow rate: 1.0 mL/min
 Sample concentration: 0.75% by mass
 Sample injection volume: 50 µL
 Detector: differential refractometer
 Standard substance: monodisperse polystyrene
Synthesis Example 2

In a four-neck separable flask equipped with a stirrer, 1,1-bis(4-hydroxyphenyl)-3,3,5-trimethylcyclohexane (BisTMC) (10.7 g, 34.5 mmol), 3,6-dichloropyridazine (Pyd) (5.1 g, 34.2 mmol) and potassium carbonate (6.5 g, 47.0 mmol) were weighed, N-methyl-2-pyrrolidone (36 g) was added, and the reaction was carried out at 145° C. for 9 hours in a nitrogen atmosphere. After completion of the reaction, N-methyl-2-pyrrolidone (150 g) was added for dilution, and after removing salts by filtration, the solution was poured into methanol (3 kg). The precipitated solid was separated by filtration, washed with a small amount of methanol, recovered by filtration again, and then dried under the same conditions as in Synthesis Example 1, thereby obtaining a polymer P-2 having a structural unit represented by the following formula (P-2) (recovery amount 7.6 g, yield 48%, weight average molecular weight (Mw); 30000, glass transition temperature) (Tg); 232° C.). Note that the weight average molecular weight and glass transition temperature were measured in the same manner as in Synthesis Example 1.

[Chemical Formula 4]

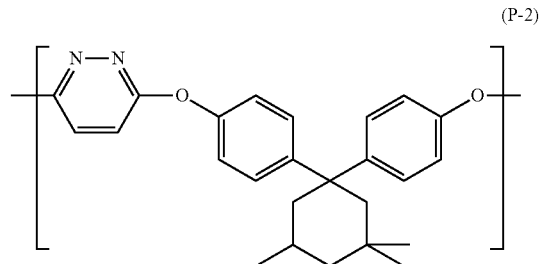

(P-2)

Synthesis Example 3

In a four-neck separable flask equipped with a stirrer, 1,1-bis(4-hydroxyphenyl)-3,3,5-trimethylcyclohexane (BisTMC) (18.6 g, 60.0 mmol), 4,6-dichloro-2-phenylpyrimidine (PhPym) (13.7 g, 61.1 mmol), and potassium carbonate (11.4 g, 82.5 mmol) were weighed, N-methyl-2-pyrrolidone (75 g) was added, and the reaction was carried out at 130° C. for 6 hours in a nitrogen atmosphere. After completion of the reaction, N-methyl-2-pyrrolidone (368 g) was added for dilution, salts were removed by filtration, and then the solution was poured into methanol (9.1 kg). The precipitated solid was separated by filtration, washed with a small amount of methanol, recovered by filtration again, and then dried under the same conditions as in Synthesis Example 1, thereby obtaining a polymer P-3 having a structural unit represented by Formula (P-3) below (recovery amount 20.5 g, yield 90%, weight average molecular weight (Mw); 187000, glass transition temperature) (Tg); 223° C.) Note that the weight average molecular weight and the glass transition temperature were measured in the same manner as in Synthesis Example 1.

[Chemical Formula 5]

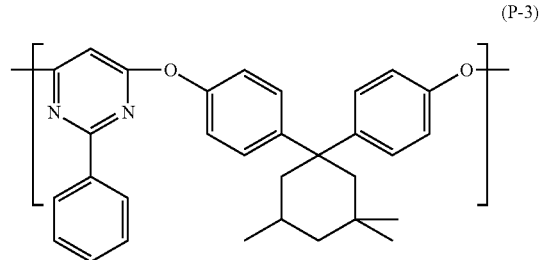

(P-3)

<Synthesis Example 4>

In a four-neck separable flask equipped with a stirrer, 1,1-bis (4-hydroxyphenyl)-3,3,5-trimethylcyclohexane (BisTMC) (12.4 g, 40.0 mmol), 2,2-bis(4-hydroxyphenyl)-propane (BisA) (2.3 g, 10.0 mmol), 1,1-bis (4-hydroxyphenyl)-nonane (BisP-DED) (3.3 g, 10.0 mmol), 4,6-dichloro-2-phenylpyrimidine (PhPym) (13.7 g, 61.1 mmol), and potassium carbonate (11.4 g, 82.5 mmol) were weighed, N-methyl-2-pyrrolidone (75 g) was added, and the reaction was carried out at 130° C. for 6 hours in a nitrogen atmosphere. After completion of the reaction, N-methyl-2-pyrrolidone (368 g) was added for dilution, salts were removed by filtration, and then the solution was poured into methanol (9.1 kg). The precipitated solid was separated by filtration, washed with a small amount of methanol, recovered by filtration again, and then dried under the same conditions as in Synthesis Example 1, thereby obtaining a polymer P-4 having a structural unit represented by Formula (P-4) below (recovery amount 23.5 g, yield 87%, weight average molecular weight (Mw); 165000, glass transition temperature) (Tg); 196° C.). Note that the weight average molecular weight and the glass transition temperature were measured in the same manner as in Synthesis Example 1.

[Chemical Formula 6]

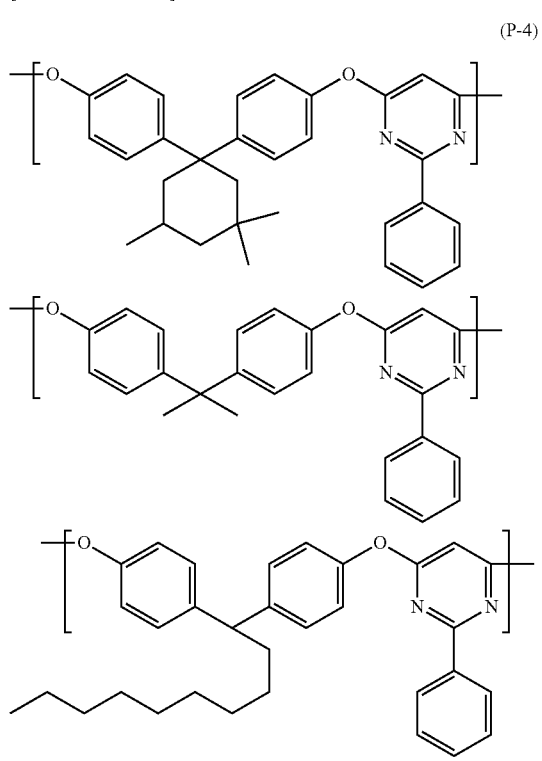

(P-4)

Synthesis Example 5

In a four-neck separable flask equipped with a stirrer, 1,1-bis(4-hydroxyphenyl)-3,3,5-trimethylcyclohexane (BisTMC) (12.4 g, 40.0 mmol), 4,4'-(1,3-dimethylbutyl-idene) bisphenol (BisP-MIBK) (2.7 g, 10.0 mmol), 1,1-bis (4-hydroxyphenyl)-nonane (BisP-DED) (3.3 g, 10.0 mmol), 4,6-dichloro-2-phenylpyrimidine (PhPym) (13.7 g, 61.1 mmol), and potassium carbonate (11.4 g, 82.5 mmol) were weighed, N-methyl-2-pyrrolidone (75 g) was added, and the reaction was carried out at 130° C. for 6 hours in a nitrogen atmosphere. After completion of the reaction, N-methyl-2-pyrrolidone (368 g) was added for dilution, salts were removed by filtration, and then the solution was poured into methanol (9.1 kg). The precipitated solid was separated by filtration, washed with a small amount of methanol, recovered by filtration again, and then dried under the same conditions as in Synthesis Example 1, thereby obtaining a polymer P-5 having a structural unit represented by Formula (P-5) below (recovery amount 23.8 g, yield 88%, weight average molecular weight (Mw); 157000, glass transition temperature) (Tg); 190° C.). Note that the weight average molecular weight and glass transition temperature were measured in the same manner as in Synthesis Example 1.

[Chemical Formula 7]

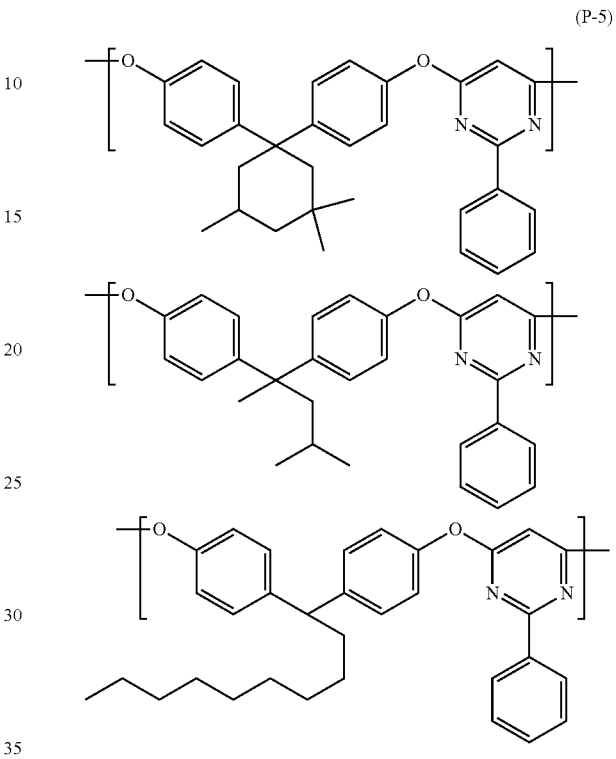

(P-5)

2.2. Example 1

2.2.1. Production of B-stage Resin Layer/Release Layer Laminate 50 parts of polymer P-1, 50 parts of 2,2'-bis (4-cyanatophenyl)propane (available from Tokyo Chemical Industry Co., Ltd.) as a curable compound, and 5 parts of 1-benzyl-2-methylimidazole as a curing aid (product name "BMI 12" available from Mitsubishi Chemical Corporation), and 160 parts of cyclopentanone were mixed to prepare a resin layer composition.

As a release layer, the resin layer composition prepared above was coated on a 100 μm thick PET film (Teijin Tetron Film G2 available from Teijin Film Solutions Co., Ltd.) with a bar coater so that the film thickness after curing was 25 μm, and heated at 70° C. for 10 minutes using an oven. Thereafter, the coating was heated at 130° C. for 10 minutes, thereby obtaining a "B-stage resin layer/release layer laminate" in which the B-stage resin layer was laminated on the PET film.

Surface Roughness Ra

The surface of the resin layer of the "B-stage resin layer/release layer laminate" obtained above was measured using a white interference microscope (New View 5032 available from ZYGO Corporation), and "arithmetic average roughness" calculated for the 10 μm×10 μm range in accordance with JIS B0601-2001 was used as the surface roughness Ra. The results are shown in Table 1.

Measurement of Elastic Modulus of Resin Layer at 50° C. to 200° C.

The release layer (PET film) was peeled off from the "B-stage resin layer/release layer laminate" obtained above, a test piece (width 3 mm×length 2 cm) was cut out, and the maximum value of the elastic modulus (MPa) in the temperature range of 50° C. or higher and lower than 80° C. and the minimum value of the elastic modulus (MPa) in the temperature range of 80° C. or higher and 200° C. or lower was measured using a DMS tester (available from Seiko Instruments Inc.) under the measurement condition of 1 Hz and 10° C./min. The results are shown in Table 1.

2.2.2. Production of Metal Layer/B-Stage Resin Layer/Release Layer Laminate

A 18 μm thick copper foil (model number "TQ-M4-VSP", surface roughness 110 nm, available from Mitsui Mining & Smelting Co., Ltd.) was overlaid on the exposed resin layer of the "B-stage resin layer/release layer laminate" obtained above, further the laminate was pressed with a hot roll at 150° C. under a linear load of 10 kN/m, thereby producing a "metal layer/B-stage resin layer/release layer laminate" having a laminate structure of copper foil/B-stage resin layer/PET film. Note that the surface roughness Ra of the copper foil was measured using a white interference microscope (New View 5032 available from ZYGO), and the "arithmetic mean roughness" calculated for the 10 μm×10 μm range was defined as the surface roughness Ra in accordance with JIS B0601-2001. The results are shown in Table 1.

Surface Roughness After Release Layer Release Ra

The release layer (PET film) was peeled off from the "metal layer/B-stage resin layer/release layer laminate" obtained above, and the surface of the exposed resin layer was measured using a white interference microscope (New View 5032 available from ZYGO Corporation), and the "arithmetic mean roughness" calculated for a range of 10 μm×10 μm in accordance with JIS B0601-2001 was used as the surface roughness Ra. The results are shown in Table 1.

2.2.3. Production and Evaluation of High-Frequency Circuit Laminate

The release layer (PET film) was peeled off from the "metal layer/B-stage resin layer/release layer laminate" obtained above, and the exposed resin layer surface and an 18 μm thick copper foil (model number "TQ-M4-VSP", surface roughness 110 nm, available from Mitsui Mining & Smelting Co., Ltd.) were placed on top of each other, pressed with a hot roll at 150° C. under a linear load of 10 kN/m, and then heated at 250° C. for 3 hours using an oven, thereby producing a high-frequency circuit laminate having a laminated structure of "copper foil (film thickness: 18 μm)/C-stage resin layer (film thickness: 25 μm)/copper foil (film thickness: 18 μm)" in which copper foil was laminated on both sides of the C-stage resin layer. Note that the surface roughness Ra of the copper foil (metal layer) was measured using a white interference microscope (New View 5032, available from ZYGO Corporation), and the "arithmetic average roughness" calculated for a range of 10 μm×10 μm based on JIS B0601-2001 was defined as the surface roughness Ra. The results are shown in Table 1.

Tensile Strength and Tensile Elongation

The produced high-frequency circuit laminate was subjected to etching treatment to remove the copper foil, thereby producing a resin film for evaluation. A dumbbell-shaped test piece of JIS K 7161 7 was cut out from the prepared resin film, and pulled at 5 mm/min using "Ez-LX" available from Shimadzu Corporation, and the stress and elongation at break were measured as tensile strength and tensile elongation, respectively. The results are shown in Table 1.

Glass Transition Temperature (Tg)

The produced high-frequency circuit laminate was subjected to etching treatment to remove the copper foil, thereby producing a resin film for evaluation. A test piece (width 3 mm×length 1 cm) was cut out from the prepared resin film, and the glass transition temperature (Tg) was measured using a DMS tester (model number "EXSTAR4000", available from Seiko Instruments Inc.). The results are shown in Table 1.

Elastic Modulus

The produced high-frequency circuit laminate was subjected to etching treatment to remove the copper foil, thereby producing a resin film for evaluation. A dumbbell-shaped test piece of JIS K7161 7 was cut out from the prepared resin film, and a tensile test was performed at 5 mm/min in accordance with JIS K7161 using "Ez-LX" available from Shimadzu Corporation to measure the tensile modulus of elasticity. The results are shown in Table 1.

Electrical Characteristics (Relative Permittivity and Dielectric Loss Tangent)

The produced high-frequency circuit laminate was subjected to etching treatment to remove the copper foil, thereby producing a resin film for evaluation. A test piece (2.6 mm wide×80 mm long) was cut out from the produced resin film and measured for the relative permittivity and the dielectric loss tangent at 10 GHz using a dielectric constant measuring device by cavity perturbation method (model No. "PNA-L Network Analyzer N5230A" available from Agilent Technologies and a model number "Cavity Resonator CP 531 for 10 GHz" available from Kanto Electronic Application and Development Inc.). The results are shown in Table 1.

Peel Strength

A test piece (1 cm wide×10 cm long) was cut out from the produced high-frequency circuit laminate, and was pulled in the direction of 90° at 500 mm/min using "Instron 5567" available from Instron, and the peel strength was measured in accordance with "IPC-TM-650 2.4.9" The results are shown in Table 1.

2.2.4. Production and Evaluation of Circuit Board

One side of the high-frequency circuit laminate prepared above was patterned with a copper foil using a photosensitive dry film, and copper wiring patterns having a pitch of 150 μm and a line width of 40, 45, 50, 55 and 60 μm, and a pitch of 750 μm and a line width of 200, 220, 240, 260 and 280 μm were prepared. Next, on the surface of the prepared copper wiring pattern, the "B-stage resin layer/release layer laminate" prepared as described above was placed in such a manner that the B-stage resin layer side contacts the copper wiring of the patterned high-frequency circuit laminate, and then a panel board was placed thereon. After forming with heat and pressure under pressing conditions at 120° C./3.0 MPa/5 min, the release layer (PET film) was peeled off, followed by heating at 250° C. for 3 hours to produce a circuit board.

Evaluation of Step

The cross-sectional shape of the circuit board produced above was observed using a scanning electron microscope, and the thickness A (μm) of the resin layer in the wiring portion and the thickness B (μm) of the resin layer in the non-wiring portion were measured. The results are shown in Table 1. When (A−B)/B was 0.1 or less, the flatness was judged to be good, and when it exceeded 0.1, the flatness was judged to be poor.

Transmission Loss Evaluation

The circuit board prepared above was measured for the transmission loss at a frequency of 20 GHz at 25° C. using a measurement probe (Single (ACP40GSG250), available from Cascade Microtech, Inc.) and a vector network analyzer (E8363B, available from Keysight technology). When the transmission loss was −5 dB/100 mm or greater, it was judged to be good.

Evaluation of Substrate Step

Both surfaces of the high-frequency circuit laminate prepared above were etched so that the thickness of the copper foil was 9 μm, further the copper foil was patterned using a photosensitive dry film to prepare a copper wiring pattern having a pitch of 100 μm and a line width of 50 μm.

Next, the release layer (PET film) was peeled off from the "metal layer/B-stage resin layer/release layer laminate" produced above, the laminate was arranged on both sides so that the peeled and exposed resin layer and the prepared copper wiring pattern were in contact with each other. Further, the object was sandwiched between end plates, heated and pressed under pressing conditions of 120° C./1.1 MPa/2 minutes, and further heated at 250° C. for 3 hours.

Thereafter, the copper foil was patterned using a photosensitive dry film, and a copper wiring pattern with a pitch of 100 μm and a line width of 50 μm was formed on both sides.

Finally, the release layer (PET film) was peeled off from the "B-stage resin layer/release layer laminate" produced above, the laminate was arranged on both sides so that the resin layer on the release surface and the prepared copper wiring pattern are in contact with each other. Further, the object was sandwiched between end plates, formed by heating and pressing under pressing conditions of 120° C./1.1 MPa/2 minutes, followed by further heating at 250° C. for 3 hours, thereby producing an evaluation substrate having four layers of copper wiring.

The cross-sectional shape of the produced substrate for evaluation was observed using a scanning electron microscope. When the difference between the recessed part and the convex part was 5% or less, the substrate was judged to be practical and good, and when the difference was greater than 5%, the substrate was judged to be impractical and defective. The results are shown in Table 1.

2.3. Examples 2 to 6 and Comparative Examples 1 to 3

A circuit board was produced and evaluated in the same manner as in Example 1 except that the resin layer composition was changed to the composition shown in Table 1, and the type of the metal film and various thickness and the lamination conditions were changed as shown in Table 1. The results are shown in Table 1.

2.4. Example 7

The resin layer composition prepared in Example 1 was coated on a 18 μm thick copper foil (model number "TQ-M4-VSP", surface roughness 110 nm, available from Mitsui Mining & Smelting Co., Ltd.) with a bar coater so that the film thickness after curing was 25 μm, and heated at 70° C. for 10 minutes using an oven. Thereafter, the coating was heated at 130° C. for 10 minutes to produce a "metal layer/B-stage resin layer laminate" having a laminate structure of copper foil/B-stage resin layer.

An 18 μm thick copper foil (model number "TQ-M4-VSP", surface roughness 110 nm, available from Mitsui Mining & Smelting Co., Ltd.) was overlaid on the exposed resin layer surface of the produced "metal layer/B-stage resin layer laminate", pressed with a hot roll at 150° C. under a linear load of 10 kN/m, and then heated at 250° C. for 3 hours using an oven to produce a high-frequency circuit laminate body having a laminate structure of copper foil (film thickness 18 μm)/C-stage resin layer (film thickness 25 μm)/copper foil (film thickness 18 μm) in which copper foils were laminated on both sides of the C-stage resin layer. Using the high-frequency circuit laminate thus produced, a circuit board was produced and evaluated in the same manner as in Example 1. The results are shown in Table 1.

2.5. Comparative Example 4

The resin layer composition was prepared in the same manner as in Example 1 so as to have the composition shown in Table 1, coated on a 18 μm thick copper foil (model number "TQ-M4-VSP", surface roughness 110 nm, available from Mitsui Mining & Smelting Co., Ltd.) with a bar coater so that the film thickness after curing was 25 μm, and heated at 70° C. for 10 minutes using an oven. Thereafter, the coating was heated at 130° C. for 10 minutes, and further heated at 250° C. for 3 hours.

Thereafter, the exposed resin layer surface was subjected to copper sputtering, thereby producing a high-frequency circuit laminate having a laminate structure of copper foil (film thickness 18 μm)/resin layer (25 μm)/copper layer (1 μm) in which copper layers were laminated on both sides of the resin layer. Using the high-frequency circuit laminate thus produced, a circuit board was produced and evaluated in the same manner as in Example 1. The results are shown in Table 1.

2.6. Evaluation Results

Table 1 shows the resin layer composition used in each of the examples and comparative examples, and the evaluation results of the high-frequency circuit laminates and the circuit boards.

TABLE 1

| | | | Example | | | | | | |
|---|---|---|---|---|---|---|---|---|---|
| | | | 1 | 2 | 3 | 4 | 5 | 6 | 7 |
| Resin layer composition | Polymer | Type | P-1 | P-1 | P-2 | P-3 | P-4 | P-5 | P-1 |
| | | Parts by mass | 50 | 35 | 50 | 50 | 50 | 50 | 50 |
| | Curable compound | Type | Compound A | Compound B | Compound A | Compound A | Compound A | Compound A | Compound A |
| | | Parts by mass | 50 | 65 | 50 | 50 | 50 | 50 | 50 |
| | Curing aid | Type | Curing aid A | Curing aid A | Curing aid A | Curing aid B | Curing aid A | Curing aid A | Curing aid A |
| | | Parts by mass | 5 | 2.5 | 5 | 0.2 | 5 | 5 | 5 |
| | Solvent | Type | Solvent A | Solvent B | Solvent A | Solvent A | Solvent A | Solvent A | Solvent A |
| | | Parts by mass | 160 | 200 | 160 | 160 | 160 | 160 | 160 |
| Metal layer/B-stage resin layer | B-stage resin layer | Surface roughness Ra (nm) | 35 | 29 | 32 | 34 | 34 | 34 | 20 |
| B-stage resin layer (/release | | Surface roughness Ra (nm) after peeling of release layer | 20 | 18 | 19 | 20 | 22 | 21 | — |

TABLE 1-continued

| | | | | | | | | | |
|---|---|---|---|---|---|---|---|---|---|
| layer) laminate | | Maximum value of elastic modulus at 50° C. or higher and lower than 80° C. (MPa) | 6 | 4 | 6 | 6 | 5 | 6 | — |
| | | Minimum value of elastic modulus (MPa) at 80° C. or higher and 200° C. or lower | 0.5 | 0.08 | 0.5 | 0.5 | 0.3 | 0.5 | — |
| | Metal layer | Type | Electrolytic copper foil A | Electrolytic copper foil B | Rolled copper foil A | Electrolytic copper foil A | Electrolytic copper foil A | Electrolytic copper foil A | Electrolytic copper foil A |
| | | Surface roughness Ra (nm) | 110 | 150 | 35 | 110 | 110 | 110 | 110 |
| | | Thickness (μm) | 18 | 18 | 35 | 12 | 18 | 18 | 18 |
| High-frequency circuit laminate | C-stage resin layer | Thickness (μm) | 25 | 25 | 100 | 25 | 25 | 25 | 25 |
| | | Tensile strength (MPa) | 100 | 70 | 75 | 56 | 78 | 84 | 95 |
| | | Tensile elongation (%) | 4 | 11 | 3 | 10 | 38 | 28 | 4 |
| | | Tg (° C.) | 230 | 168 | 173 | 162 | 164 | 173 | 230 |
| | | Elastic modulus (GPa) | 1.8 | 0.3 | 1.8 | 1.8 | 1.4 | 1.7 | 1.8 |
| | | Relative permittivity | 2.6 | 3 | 2.6 | 2.6 | 2.8 | 2.8 | 2.6 |
| | | Dielectric loss tangent | 0.005 | 0.009 | 0.005 | 0.005 | 0.004 | 0.004 | 0.005 |
| | Metal layer | Type | Electrolytic copper foil A | Electrolytic copper foil B | Rolled copper foil A | Electrolytic copper foil A | Electrolytic copper foil A | Electrolytic copper foil A | Electrolytic copper foil A |
| | | Surface roughness Ra (nm) | 110 | 150 | 35 | 110 | 110 | 110 | 110 |
| | | Thickness (μm) | 18 | 18 | 35 | 12 | 18 | 18 | 18 |
| | Lamination condition | Heating temperature (° C.) | 150 | 150 | 160 | 110 | 180 | 170 | 170 |
| | | Load (kN/m) | 10 | 17 | 14 | 15 | 16 | 15 | 13 |
| | Laminate properties | Laminate thickness (μm) | 61 | 61 | 170 | 49 | 61 | 61 | 61 |
| | | Peel strength (N/cm) | 7 | 7.8 | 5.3 | 6.2 | 7.5 | 8.3 | 8 |
| Circuit board | | Thickness A of resin layer in the wiring portion (μm) | 25.3 | 25.1 | 27 | 26.3 | 26.5 | 26.7 | 25.3 |
| | | Thickness B of the resin layer in the non-wiring portion (μm) | 25 | 25 | 25 | 25 | 25 | 25 | 25 |
| | | (A − B)/B | 0.012 | 0.004 | 0.08 | 0.052 | 0.06 | 0.068 | 0.012 |
| Circuit board evaluation | | Transmission loss (dB/100 mm) | −4.6 | −4.9 | −4.2 | −4.5 | −4.2 | −4 | −4.6 |
| | | Substrate step | Good | Good | Good | Good | Good | Good | Good |

| | | | | Comparative Example | | | |
|---|---|---|---|---|---|---|---|
| | | | | 1 | 2 | 3 | 4 |
| Resin layer composition | Polymer | Type | | P-1 | P-1 | P-1 | P-6 |
| | | Parts by mass | | 100 | 10 | 80 | 10 |
| | Curable compound | Type | | — | Compound B | Compound C | Compound B |
| | | Parts by mass | | — | 90 | 20 | 90 |
| | Curing aid | Type | | Curing aid A | Curing aid A | Curing aid A | Curing aid A |
| | | Parts by mass | | 5 | 5 | 5 | 5 |
| | Solvent | Type | | Solvent A | Solvent A | Solvent A | Solvent A |
| | | Parts by mass | | 160 | 160 | 160 | 160 |
| Metal layer/B-stage resin layer (/release layer) laminate | B-stage resin layer | Surface roughness Ra (nm) | | 45 | 29 | 42 | 0.01 |
| | | Surface roughness Ra (nm) after peeling of release layer | | 24 | 18 | 21 | 37 |
| | | Maximum value of elastic modulus at 50° C. or higher and lower than 80° C. (MPa) | | 860 | 4 | 10 | 3 |
| | | Minimum value of elastic modulus (MPa) at 80° C. or higher and 200° C. or lower | | 520 | 0.08 | 15 | 3 |
| | Metal layer | Type | | Electrolytic copper foil A | Electrolytic copper foil B | Electrolytic copper foil A | Electrolytic copper foil A |
| | | Surface roughness Ra (nm) | | 110 | 350 | 110 | 110 |

TABLE 1-continued

| | | | | | | |
|---|---|---|---|---|---|---|
| High-frequency circuit laminate | C-stage resin layer | Thickness (μm) | 18 | 18 | 18 | 18 |
| | | Thickness (μm) | 25 | 25 | 25 | 25 |
| | | Tensile strength (MPa) | 65 | 70 | 89 | 44 |
| | | Tensile elongation (%) | 11 | 11 | 3 | 6 |
| | | Tg (° C.) | 220 | 168 | 220 | 150 |
| | | Elastic modulus (GPa) | 3.5 | 0.3 | 2.4 | 0.2 |
| | | Relative permittivity | 2.5 | 3.2 | 2.9 | 3.2 |
| | | Dielectric loss tangent | 0.003 | 0.02 | 0.008 | 0.02 |
| | Metal layer | Type | Electrolytic copper foil A | Electrolytic copper foil B | Electrolytic copper foil A | Sputtered copper film |
| | | Surface roughness Ra (nm) | 110 | 350 | 110 | 3 |
| | | Thickness (μm) | 18 | 18 | 18 | 1 |
| | Lamination condition | Heating temperature (° C.) | 150 | 150 | 210 | 220 |
| | | Load (kN/m) | 10 | 20 | 10 | 0.5 |
| | Laminate properties | Laminate thickness (μm) | 61 | 61 | 61 | 44 |
| | | Peel strength (N/cm) | 4.7 | 7.8 | 6 | 3.3 |
| Circuit board | | Thickness A of resin layer in the wiring portion (μm) | 32 | 25.1 | 30.8 | 25 |
| | | Thickness B of the resin layer in the non-wiring portion (μm) | 25 | 25 | 25 | 25 |
| | | (A − B)/B | 0.28 | 0.004 | 0.232 | 0 |
| Circuit board evaluation | | Transmission loss (dB/100 mm) | −5.3 | −5.5 | −5.1 | −6.8 |
| | | Substrate step | Poor | Poor | Poor | Poor |

In Table 1, the following abbreviations are supplemented.

Polymer
 P-6: model number "PPO Resin Powder" available from Sabic, glass transition temperature (Tg): 215° C.

Curable Compound
 Compound A: 2,2'-bis (4-cyanatophenyl) propane (available from Tokyo Chemical Industry Co., Ltd.)
 Compound B: SR-16H (available from Sakamoto Yakuhin Kogyo Co., Ltd, epoxy equivalent; 160 g/eq)
 Compound C: HP-4032D (available from DIC, epoxy equivalent; 141 meq/g)

Curing Aid
 Curing aid A: 1-benzyl-2-methylimidazole (available from Mitsubishi Chemical Corporation, product name "BMI 12")
 Curing aid B: zinc 2-ethyloctylate (available from Wako Pure Chemical Industries, Ltd.)

Solvent
 Solvent A: Cyclopentanone (available from y Tokyo Chemical Industry Co., Ltd.)
 Solvent B: methylene chloride (available from Tokyo Chemical Industry Co., Ltd.)

Metal Layer Type
 Electrolytic copper foil A: product number "TQ-M4-VSP" available from Mitsui Mining & Smelting Co., Ltd.
 Electrolytic copper foil B: product number "3EC-M3S-HTE" available from Mitsui Mining & Smelting Co., Ltd.
 Rolled copper foil A: product number "GHY5-HA" available from JX Nippon Mining & Metals Corporation The results shown in Table 1 indicates that the circuit boards obtained in Examples 1 to 7 reduced the transmission loss of electric signals in the high-frequency circuit, and had excellent smoothness.

REFERENCE SIGNS LIST

10. Substrate
12. Resin layer
14. Metal layer
16. Wiring portion
20. Release layer
21. Resin layer surface (exposed surface)
22. B-stage resin layer
23. Resin layer surface (exposed surface)
24. Metal layer
26. Metal layer
28. C-stage resin layer
30. Metal layer
32. B-stage resin layer
33. Resin layer surface (exposed surface)
34. Metal layer
36. C-stage resin layer
100. Circuit board
200. High-frequency circuit laminate
300. High-frequency circuit laminate

The invention claimed is:

1. A circuit board, comprising:
a wiring portion and
a non-wiring portion,
wherein the wiring portion comprises a metal layer and a resin layer,
the non-wiring portion comprises the resin layer,
the wiring portion is a portion of the metal layer formed on a substrate and the resin layer laminated on the metal layer in the +Z direction,
the non-wiring portion is a portion of the resin layer other than the wiring portion,
the resin layer comprises a polymer having a repeating unit represented by at least one of the following formulas (1-1), (1-2) and (1-3), and a repeating unit represented by the following formula (2), a curable compound, and a curing aid,
the resin layer at a frequency 10 GHz has a relative permittivity of from 2 to 3 at 23° C., and
the circuit board satisfies a relationship:

$$(A-B)/B \leq 0.1,$$

wherein A is a maximum value of a thickness in the wiring portion (μm) and B is a minimum value of a thickness in the non-wiring portion (μm)

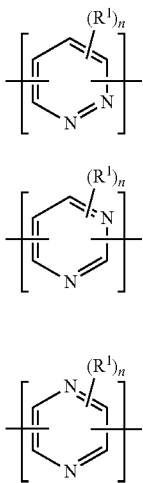

wherein in the formulae (1-1) to (1-3), $R^1$ are each independently a halogen atom, a monovalent hydrocarbon group having 1 to 20 carbon atoms, a monovalent halogenated hydrocarbon group having 1 to 20 carbons, a nitro group, a cyano group, a primary to tertiary amino group, or a salt of a primary to tertiary amino group, n is each independently an integer of 0 to 2 and wherein when n is 2, the plurality of $R^1$s is may be the same or different, and may bond in any combination to form part of a ring structure,

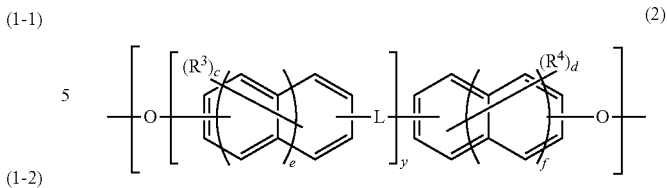

wherein in the formula (2), $R^3$ and $R^4$ are each independently a halogen atom, a nitro group, a cyano group, or a monovalent hydrocarbon group or halogenated hydrocarbon group having from 1 to 20 carbon atoms, c and d are each independently an integer from 0 to 8, e, f, and y are each independently an integer of 0 to 2, and L is a single bond, —O—, —S—, —CO—, —SO—, —SO$_2$—, or a divalent organic group having from 1 to 20 carbon atoms.

2. The circuit board according to claim 1, wherein the metal layer and the resin layer in the wiring portion are in direct contact with each other.

3. The circuit board according to claim 1, wherein a dielectric loss tangent of the resin layer at a frequency 10 GHz is from 0.001 to 0.01 at 23° C.

4. The circuit board according to claim 1, wherein the resin layer has an elastic modulus of from 0.1 to 3 GPa.

5. The circuit board according to claim 1, wherein a peel strength between the resin layer and the metal layer is 5 N/cm or greater.

6. The circuit board according to claim 1, wherein a thickness of the resin layer is from 10 to 100 μm, and a thickness of the metal layer is from 10 to 50 μm.

* * * * *